(12) United States Patent
Watakabe et al.

(10) Patent No.: US 8,085,355 B2
(45) Date of Patent: Dec. 27, 2011

(54) STRUCTURE OF THIN FILM TRANSISTORS AND LIQUID CRYSTAL DISPLAY DEVICE HAVING THE SAME

(75) Inventors: Hajime Watakabe, Fukaya (JP); Masato Hiramatsu, Tokyo (JP); Toshiya Kiyota, Saitama (JP); Mikio Murata, Kumagaya (JP); Masaki Kado, Saitama (JP); Arichika Ishida, Okegawa (JP); Yoshiaki Nakazaki, Saitama (JP)

(73) Assignee: Toshiba Mobile Display Co., Ltd., Tokyo (JP)

( * ) Notice: Subject to any disclaimer, the term of this patent is extended or adjusted under 35 U.S.C. 154(b) by 226 days.

(21) Appl. No.: 12/547,340

(22) Filed: Aug. 25, 2009

(65) Prior Publication Data

US 2010/0110322 A1      May 6, 2010

(30) Foreign Application Priority Data

Aug. 26, 2008   (JP) ................... 2008-217278

(51) Int. Cl.
*G02F 1/136* (2006.01)
(52) U.S. Cl. .......................................... 349/47; 257/72
(58) Field of Classification Search ...................... 349/47
See application file for complete search history.

(56) References Cited

U.S. PATENT DOCUMENTS 6,333,520 B1 * 12/2001 Inoue ............................. 257/72
7,755,142 B2 * 7/2010 Matsumura et al. .......... 257/354

FOREIGN PATENT DOCUMENTS

JP          3403807      2/2003
JP      2008-021760      1/2008

* cited by examiner

*Primary Examiner* — James Dudek
(74) *Attorney, Agent, or Firm* — Finnegan, Henderson, Farabow, Garrett & Dunner, L.L.P.

(57) ABSTRACT

A structure of a plurality of thin film transistors wherein a peripheral circuit on a glass substrate of a liquid crystal display panel; and each of polycrystalline silicon thin film 13 of the thin film transistor is formed on the glass substrate; and each of gate electrode 15 is formed on a gate insulation layer, and each of the gate electrode 15 is overhead corresponding to the polycrystalline silicon thin film 13 for a channel; wherein the gate electrode 15 is comprised a pair of projection part 15A and a gate-channel 15B; and wherein the pair of projection part 15A is formed the both sides of the gate-channel 15B in which the side is for along the channel-direction, and wherein the pair of projection part 15A is enlarged for across the channel-direction.

8 Claims, 5 Drawing Sheets

[FIG. 1]
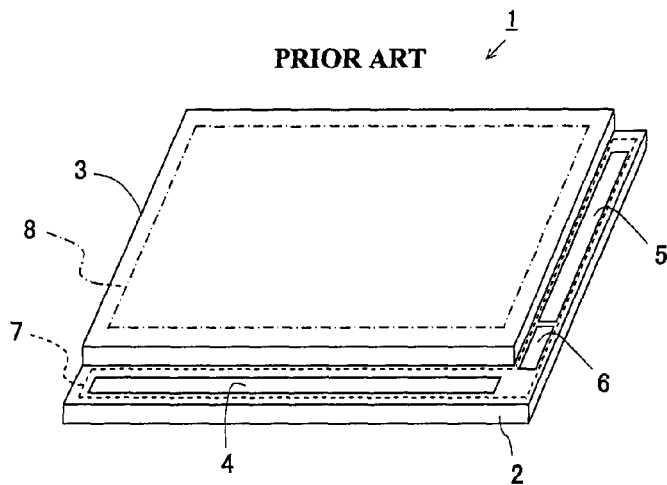
PRIOR ART
[FIG. 2]
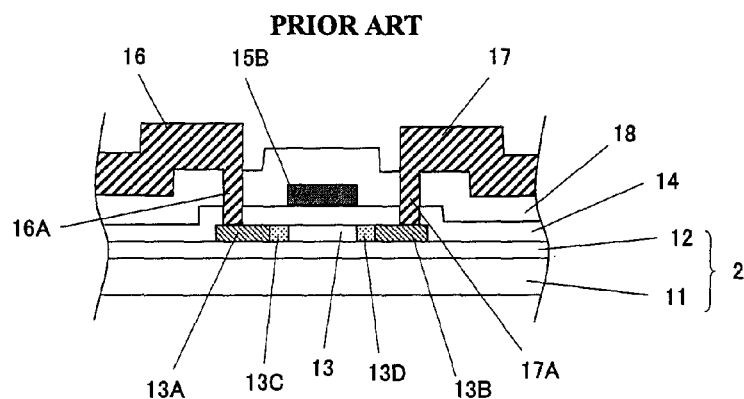
PRIOR ART
[FIG. 3]
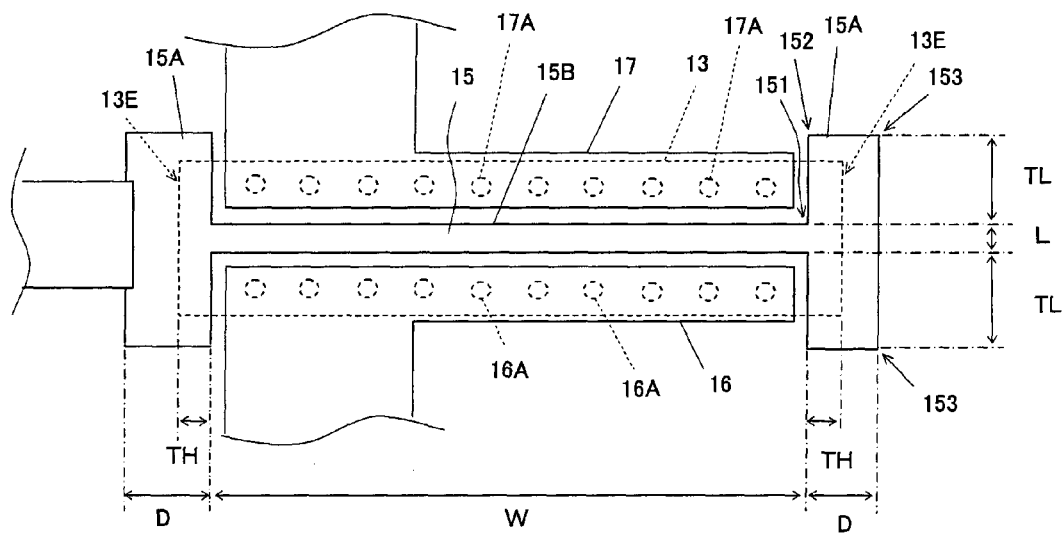

[FIG. 4]
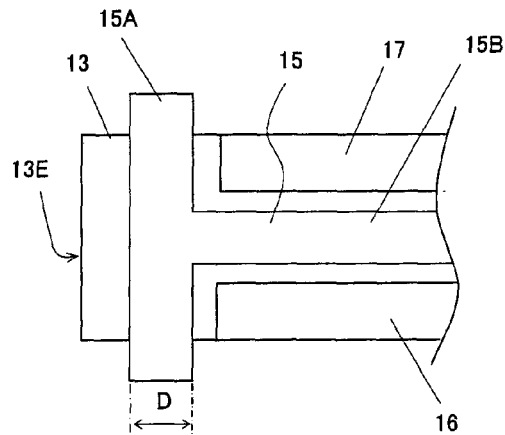
[FIG. 5]
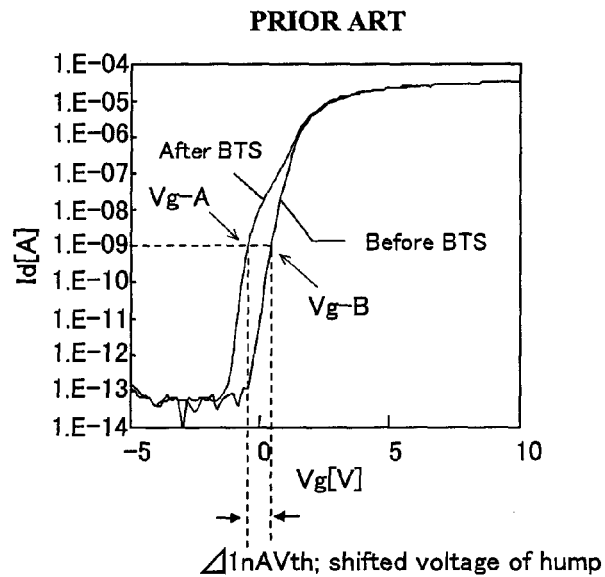
$\Delta$lnAVth; shifted voltage of hump
[FIG. 6]
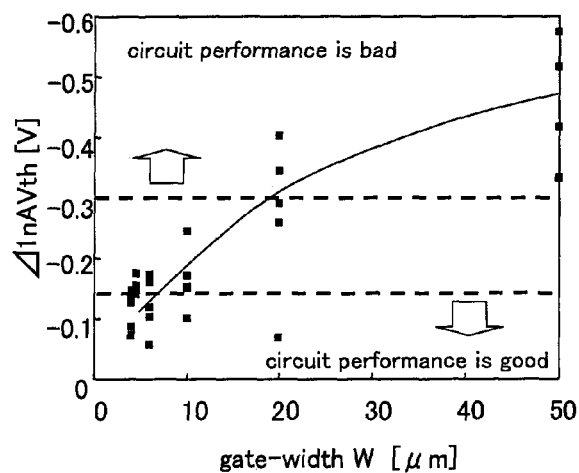

[FIG. 7]
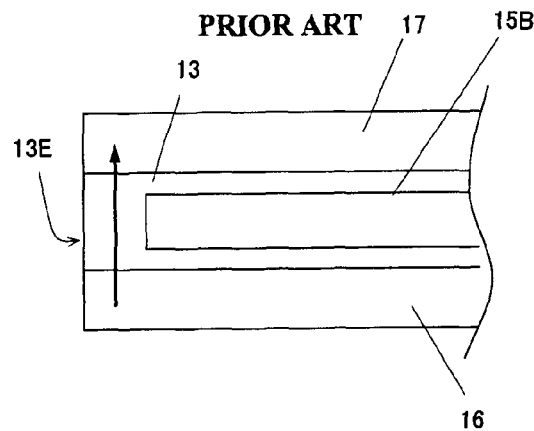
[FIG. 8]
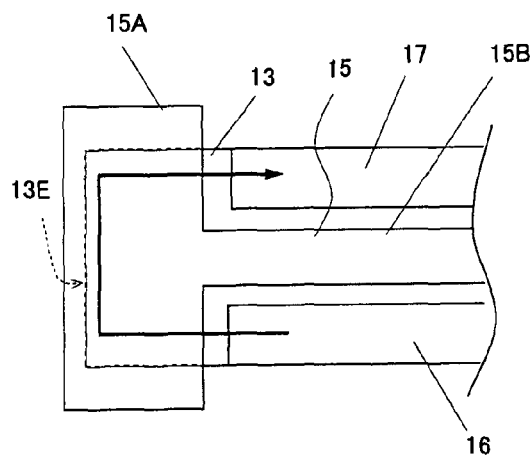
[FIG. 9]
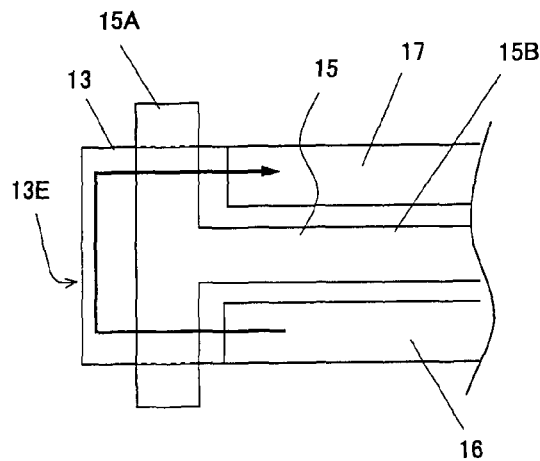

[FIG. 10]
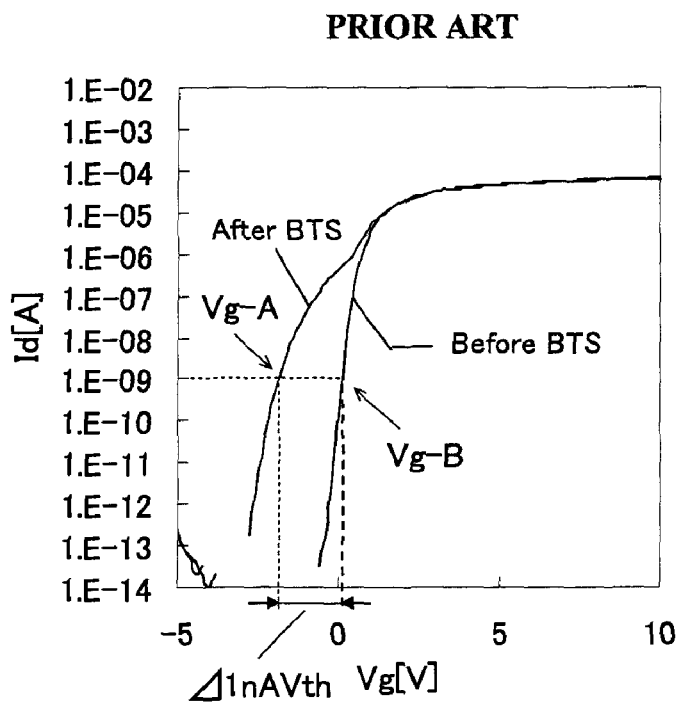
[FIG. 11]
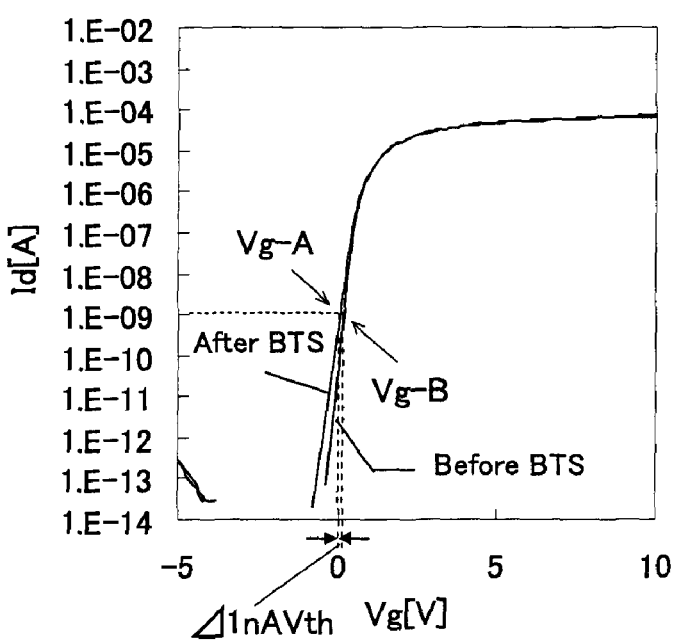

[FIG. 12]
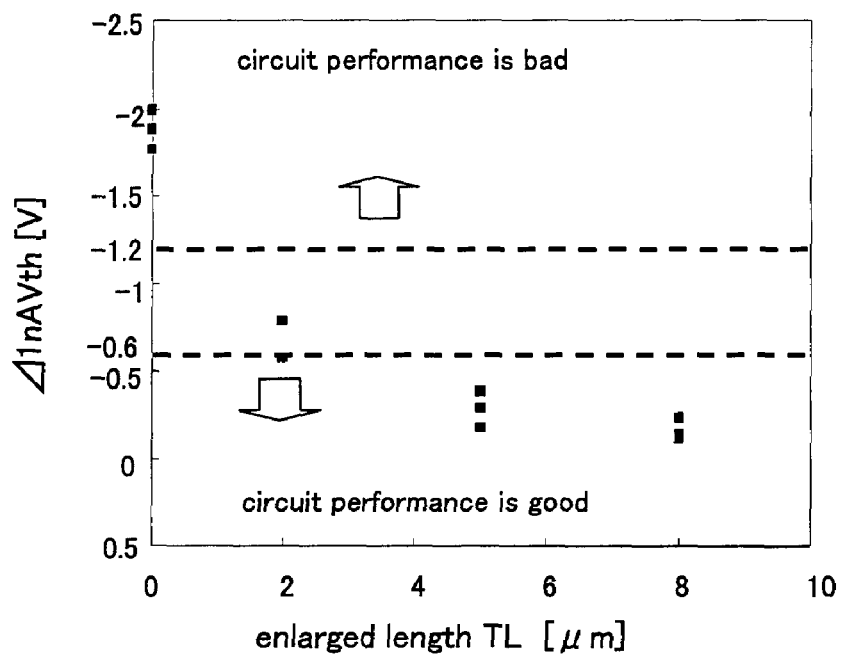
[FIG. 13]
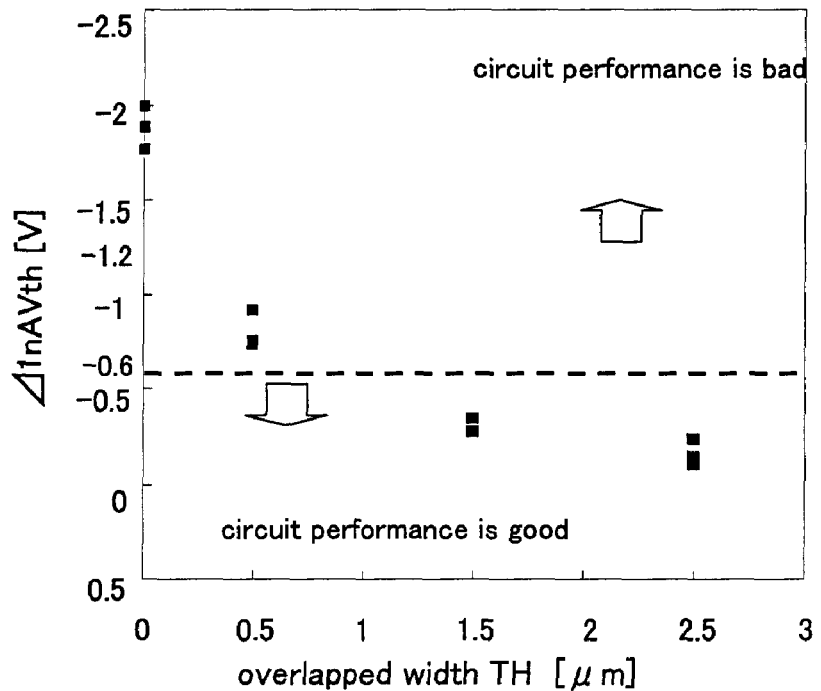

US 8,085,355 B2

STRUCTURE OF THIN FILM TRANSISTORS AND LIQUID CRYSTAL DISPLAY DEVICE HAVING THE SAME

BACKGROUND OF THE INVENTION

1. Field of the Invention

The present invention relates to a structure of a plurality of thin film transistors wherein a peripheral circuit on a glass substrate of a liquid crystal display panel, and a crystal display device having the same. In particularly, the present invention relates to suppress the over current at edge lines of polycrystalline silicon thin film that constitute channel, and the present invention relates to reduce a hump in I-V characteristics of the thin film transistors.

2. Description of the Prior Art

A polycrystalline silicon thin film transistors (polysilicon TFTs) formed on a glass substrate having a same structure as silicon on insulator (SOI) structure. So, the polysilicon TFTs having same electrical characteristics such as a SOI device. Thin film channel layer (active layer) can be work fully-depleted, so that reducing a voltage difference between the rises from off-state to on-state. That is one of the same electrical characteristics such as a SOI device.

Generally, as above TFTs are formed on a transparent substrate (glass plate). TFTs are uses to driven element for a display device such as liquid crystal display (LCD) device. It can be to display fine such as Quarter Video Graphics Array (QVGA) accuracy in 2 inches diagonal area for a display part of mobile phone, for example. It can't be realize by crystalline semiconductor.

As above TFTs are used to switching element for a display region (pixel region) in a liquid crystal display (LCD) device. However, edge conductivity that route to near pattern-edge of semiconductor thin film (polycrystalline silicon thin film) affect to display performance getting worse. Thus, the edge conductivity is cause of off-current enlargement, and the edge conductivity is cause of bad reliability of TFTs, and then image properties getting worse.

Therefore, prior art studied in improvement of TFT structure that is tried to reject as above edge conductivity. Prior art JP3403807B2 is disclosed a part of gate-electrode overlap on a part of semiconductor thin film on the TFT substrate, and the overlap part of gate-electrode is formed the projection part that along the pattern-edge of semiconductor thin film. In prior art TFT has the projection part of gate-electrode that is formed the opposite area which is opposite to the overlap part of near gate-electrode edge, and it suppress to the edge conductivity that route to the near pattern-edge of semiconductor thin film, in patent document 1.

[Patent document 1] JP3403807B2

TFT substrate in pixel region is studied to form the projection part in gate-electrode, so that is suppressing the degradation of display performance cause of the edge conductivity, as shown in patent document 1. However, TFT substrate in peripheral circuit region is not considered, in the fact.

The present invention has been proposed in view of the conventional actual situation, and the object thereof is to provide a structure of optimized TFTs in peripheral circuit region which TFTs are reduced a hump in I-V characteristics for saving power consumption, getting high reliability, reducing variation among the TFTs, and setting a margin at circuit design available. Moreover, the object of present invention is to provide a high-quality LCD device having the structure of optimized TFTs which LCD is excellent image view, saving power consumption, and getting high reliability.

SUMMARY OF THE INVENTION

To accomplish the above object, the present invention provides a structure of a plurality of thin film transistors wherein a peripheral circuit on a glass substrate of a liquid crystal display panel; and each of polycrystalline silicon thin film of the thin film transistor is formed on the glass substrate; and each of gate electrode is formed on a gate insulation layer, and each of the gate electrode is overhead corresponding to the polycrystalline silicon thin film for a channel; wherein the gate electrode is comprised a pair of projection part and a gate-channel; and wherein the pair of projection part is formed the both sides of the gate-channel in which the side is for along the channel-direction, and wherein the pair of projection part is enlarged for across the channel-direction.

And the present invention provides a liquid crystal display device having a peripheral circuit on a glass substrate of a liquid crystal display panel, wherein the peripheral circuit comprising a plurality of thin film transistors; and each of polycrystalline silicon thin film of the thin film transistor is formed on the glass substrate; and each of gate electrode is formed on a gate insulation layer, and each of the gate electrode is overhead corresponding to the polycrystalline silicon thin film for a channel; wherein the gate electrode is comprised a pair of projection part and a gate-channel; and wherein the pair of projection part is formed the both sides of the gate-channel in which the side is for along the channel-direction, and wherein the pair of projection part is enlarged for across the channel-direction.

According to the present invention, the pattern-edge of polycrystalline silicon thin film is near the edge of the gate-channel. Thus, threshold voltage variation is occur cause of electric field concentration at the edge of the gate-channel. Then, I-V characteristics of the thin film transistor (TFT) shifted to sub-threshold area only, and a hump occurs in only sub-threshold area. In particular, above behavior occurs prominently such as the TFTs in the peripheral circuit region which has a long gate width and a short gate length. And above behavior occurs prominently as the TFT on-state of gate voltage stress, particularly gate bias temperature stress (BTS). Therefore, the hump is reduced in the peripheral circuit region on the glass substrate. It is prefer to form a long length of the enlarged projection part for across the channel-direction, and it is prefer to form a short width of the projection part for along the channel-direction.

According to the present invention, wherein the width of the gate-channel is between 10 µm and 50 µm in which the width is for along the channel-direction, and wherein the length of the gate-channel is between 0.5 µm and 2.0 µm in which the length is for across the channel-direction, in preferably. According to the present invention, edge conductivity that route to the gate-channel pattern-edge near the polycrystalline silicon thin film is even suppressed, and then the hump is reduced in the peripheral circuit.

According to the present invention, wherein the enlarged length of the projection part is between 2 µm and 8 µm, and overlapped the width of projection part and the polycrystalline silicon thin film wherein the overlapped width is between 0.5 µm and 2.5 µm, in preferably. According to the present invention, the hump is reduced well for driving the peripheral circuit without problems.

According to the present invention, the projection part is over the polycrystalline silicon thin film for across the channel-direction. According to the present invention, the gate electrode is formed for covered on a pattern-edge of polycrystalline silicon thin film. Therefore, it is certain to reduce the edge-current of the polycrystalline silicon thin film.

According to the present invention, wherein the projection part is formed an inside position of the pattern-edge line at the polycrystalline silicon thin film for along the channel-direction.

In case of the projection part is formed on-position of the pattern-edge line at the polycrystalline silicon thin film, it is easy occurrence a gate leakage current.

According to the present invention, the projection part isn't on the pattern-edge line. Therefore, gate leakage current is reduced well.

The same structure of thin film transistors (TFTs) as described is used for a liquid crystal display device. Thus, the liquid crystal display (LCD) device has an excellent image view, saving power consumption, and getting high reliability.

According to the present invention, as for a mesa isolation structure of the thin film transistors (TFTs), it is realized a structure of optimized TFTs in peripheral circuit which TFTs are reduced a hump in I-V characteristics for saving power consumption. And the peripheral circuit having the present invention of the TFTs is getting high reliability, reducing variation among the TFTs, and setting a margin at circuit design available. Moreover, a high-quality LCD device having the present invention of the TFTs which is excellent image view, saving power consumption, and getting high reliability.

The above and other objects, characteristic features and advantages of the present invention will become apparent to those skilled in the art from the description to be given herein below with reference to the accompanying drawings.

BRIEF DESCRIPTION OF THE DRAWINGS

FIG. 1 is shown a schematic perspective view of a prior-art liquid crystal display panel.

FIG. 2 is shown a cross-section view, illustrating a prior-art structure of a pixel TFT substrate.

FIG. 3 is shown a plane view, illustrating a structure of a pixel TFT substrate Embodiment 1.

FIG. 4 is shown a plane view, illustrating a structure of a side part of a pixel TFT substrate Embodiment 2.

FIG. 5 is shown a graph showing I-V characteristics of a prior-art pixel TFT substrate.

FIG. 6 is shown a graph showing a relationship between gate-width and shifted voltage of hump according a pixel TFT substrate.

FIG. 7 is shown a plane view, illustrating a prior-art structure according a side part of a pixel TFT substrate.

FIG. 8 is shown a plane view, illustrating a structure according a side part of a pixel TFT substrate Embodiment 1.

FIG. 9 is shown a plane view, illustrating a structure according a side part of a pixel TFT substrate Embodiment 2.

FIG. 10 is shown a graph showing I-V characteristics of a prior-art pixel TFT substrate.

FIG. 11 is shown a graph showing I-V characteristics of a pixel TFT substrate Embodiment 1.

FIG. 12 is shown a graph showing a relationship between projection part length and shifted voltage of hump according a pixel TFT substrate Embodiment 1.

FIG. 13 is shown a graph showing a relationship between projection part width and shifted voltage of hump according a pixel TFT substrate Embodiment 1.

DETAILED DESCRIPTION OF THE PREFERRED EMBODIMENT

An embodiment of the structure of thin film transistor (TFT) and the liquid crystal display (LCD) device according to the present invention will be described hereinafter with reference to the drawings.

FIG. 1 is shown a schematic perspective view of an example of a liquid crystal display panel, which is used for a liquid crystal display device. A liquid crystal display panel having a pair of glass substrate, wherein an array substrate 2 and a counter substrate 3. And a liquid crystal layer is sealed in between the array substrate 2 and the counter substrate 3. Thin film transistors (TFTs) as pixel transistors formed on the array substrate 2, and there are driven as switching elements, and a picture is shown the display area 8 of the liquid crystal display panel.

In the display area 8, a pixel electrodes are arranged on the array substrate 2, and the pixel electrodes in a matrix form for correspond with an each image pixels. Scanning lines are formed along a column direction of the image pixels, and signal lines are formed along a rank direction of the image pixels. And above pixel transistors are formed on each junctions that crossing scanning lines and signal lines.

In the peripheral circuit region 7 on the array substrate 2 is formed driving circuit 4 for signal line, and driving circuit 5 for scanning line, and power circuit 6, and other circuits. The peripheral circuit region 7 is so called frame area. The group of circuit 4, 5, 6, and others is called peripheral circuit. The peripheral circuit is comprised plural thin film transistors (TFTs) and wiring together with circuit. A structure of thin film transistor substrate according to the present invention is used for the peripheral circuit in the peripheral circuit region 7 on the array substrate 2.

FIG. 2 is shown a cross-section view of an example of a pixel TFT substrate uses for the peripheral circuit as above described. The peripheral circuit is comprised plural thin film transistors (TFTs), and polycrystalline silicon thin film 13 as mean duties active layer of TFTs are formed on the array substrate 2. Further, the array substrate 2 is a glass substrate 11 that is coated by undercoat layer 12, and the polycrystalline silicon thin film 13 is formed on the undercoat layer 12, and the polycrystalline silicon thin film 13 as mean duties active layer of TFTs. The active layer is called a channel layer. The present invention is related the structure of FIG. 2 that is an example of a pixel TFT substrate.

The undercoat layer 12 is formed on the glass substrate 11 as above described. The undercoat layer 12 coats a scratch or a pin-hole on the glass substrate 11 for surface flatting. And the undercoat layer 12 obstructs impurity diffusion for the polycrystalline silicon thin film 13. The undercoat layer 12 is formed in a process of silicon oxide film, silicon nitride film, or as same thin film, for example. It is possible for additional flat layer that is formed fluid resin flowing by heat-treatment on the undercoat layer obstructs impurity diffusion. I.e. the undercoat layer 12 can be laminated layer. It is possible for omit the undercoat layer 12 when the glass substrate 11 has even flatness and few impurities.

As above described the polycrystalline silicon thin film 13 is formed in a procedure as below, for example. Anneal for an amorphous silicon (a-Si) film that is formed by plasma CVD. And polycrystalline for the amorphous silicon film by laser irradiation. The polycrystalline silicon thin film 13 is isolated each element as an island by etching. An example of shows FIG. 2, the polycrystalline silicon thin film 13 is corresponds for an n-channel TFTs. Each polycrystalline silicon thin films 13 are formed a souse region 13A and a drain region 13B by impurity doping. Moreover LDD region as low-concentration impurity diffusion region 13C, 13D are formed each inside of the souse region 13A and the drain region 13B.

FIG. 2 is shown a gate insulation layer 14 cover on the polycrystalline silicon thin film 13 as above described. A gate electrode 15B is on the gate insulation layer 14, and the gate electrode 15B is overhead the channel of the polycrystalline silicon thin film 13. So, the gate electrode 15B is called a gate-channel. An interlayer dielectric 18 covers on the gate electrode 15. A source electrode 16 is formed on the interlayer dielectric 18, and a part of the source electrode 13A is connected on the souse region 13A through the interlayer dielectric 18 and the gate insulation layer 14. A drain electrode 17 is formed on the interlayer dielectric 18, and a part of the drain electrode 17 is connected on the drain region 13B through the interlayer dielectric 18 and the gate insulation layer 14.

FIG. 3 is shown a plane view, illustrating a structure of a pixel TFT substrate Embodiment 1. The peripheral circuit is comprised plural thin film transistors (TFTs), and polycrystalline silicon thin film 13 as mean duties active layer of TFTs are formed on the array substrate 2. The polycrystalline silicon thin film 13 is isolated each element as a given shape of island. The both sides of polycrystalline silicon thin films 13 are formed a souse region 13A and a drain region 13B by impurity doping. A gate electrode 15 is on the gate insulation layer 14, and the gate electrode 15 is formed for along the overhead of the polycrystalline silicon thin film 13. An interlayer dielectric 18 covers on the gate electrode 15. A source electrode 16 is formed on the interlayer dielectric 18, and a part of the source electrode 13A is connected on the souse region 13A through the interlayer dielectric 18 and the gate insulation layer 14. A drain electrode 17 is formed on the interlayer dielectric 18, and a part of the drain electrode 17 is connected on the drain region 13B through the interlayer dielectric 18 and the gate insulation layer 14. The channel of gate electrode 15 is located between the source electrode 16 and the drain electrode 17. The source electrode 16 and the drain electrode 17 are located on both sides of the polycrystalline silicon thin films 13.

According to the present invention, the gate electrode 15 is comprised a pair of projection part 15A and a gate-channel 15B. The gate-channel 15B is formed for along the overhead of the polycrystalline silicon thin film 13. The projection part 15A is formed on both sides of the gate-channel 15B, such as an alphabet-H structure show in FIG. 3. A direction along the channel is called the channel-direction. According the gate electrode 15, the width between the pair of projection part 15A is named gate-width W, shown in FIG. 3. The gate-width W is a width of the gate-channel 15B. According the gate electrode 15, the length of the gate-channel 15B for across the channel-direction is named gate-channel-length L, shown in FIG. 3.

A structure of thin film transistors (TFTs) according to the present invention is used for the peripheral circuit in the peripheral circuit region 7 on the array substrate 2. According to each of the TFT, the gate-width W is longer than the gate-channel-length L, as shown in FIG. 3. Further, the gate-width W is between 10 μm and 50 μm, and the gate-channel-length L is between 0.5 μm and 2.0 μm. The ratio as the gate-width W by gate-channel-length L (W/L) is at least 5 (W/L≧5).

As above described the large ratio W/L of TFT occurs the large level of hump in I-V characteristics cause of the edge-current. According to Embodiment 1, the pair of projection part 15A is formed on both sides of the gate-channel 15B, and a pair of pattern-edge lines 13E is overlapped the pair of projection part 15A, shown in FIG. 3. Therefore, the hump level is reduced.

And above behavior occurs prominently as the TFT on-state of gate voltage stress, particularly gate bias temperature stress (BTS). According to Embodiment 1, the pair of projection part 15A is formed on both sides of the gate-channel 15B, such as an alphabet-H structure, and a pair of pattern-edge lines 13E is covered the pair of projection part 15A, shown in FIG. 3. Therefore, the over current at the pair of pattern-edge lines 13E is suppressed.

According to Embodiment 1, the enlarged length of the projection part 15A is between 2 μm and 8 μm, in preferably. Further, the enlarged length TL of the projection part 15A is between 5 μm and 8 μm, more preferably. The enlarged length TL is the length between symbol 151 and 152, as shown in FIG. 3. According to Embodiment 1, overlapped the width D of projection part 15A and the polycrystalline silicon thin film 13 wherein the overlapped width TH is between 0.5 μm and 2.5 μm, in preferably. Further, the overlapped width TH is between 1.5 μm and 2.5 μm, more preferably. The overlapped width TH is the width between symbol 151 and 13E, as shown in FIG. 3. According to the present invention, the hump is reduced well for driving the peripheral circuit without problems.

As shown in FIG. 3, the projection part 15A is over the polycrystalline silicon thin film 13 for across the channel-direction, and the both side edges 13A are covered by projection part 15A, completely. The 15A is consisting of Metal. Therefore, the over current at the pair of pattern-edge lines 13E is suppressed and the hump level is reduced, well.

As shown in FIG. 4, the projection part 15A is over the polycrystalline silicon thin film 13 for across the channel-direction, and the projection part 15A is formed an inside position of the pair of pattern-edge lines 13E at the polycrystalline silicon thin film 13 for along the channel-direction. It is also preferably Embodiment 2 as shown in FIG. 4.

In case of the mesa isolation structure of the polycrystalline silicon thin film 13, the height of the pattern-edge is difference in level as inside. Thus, the gate leakage current is occurs between the gate electrode 15 and the pattern-edge of the polycrystalline silicon thin film 13. According to the Embodiment 2, the cross-line between the gate electrode 15 and the pattern-edge of the polycrystalline silicon thin film 13 is reduced. Therefore, the gate leakage current is reduced, well. Moreover, the width D of projection part 15A is shrinking. Therefore, parasitic capacitance is reduced. For addition, the Embodiment 2 can be narrow clearance of wiring position. Therefore, circuit integration is improved.

A further examination result according to the structure of thin film transistor (TFT) will be described hereinafter with reference to the drawings.

Relationship Between W and ⊿lnAVth

According to prior art of thin film transistor, we evaluate the relationship between gate-width W and sifted voltage of hump ⊿lnAVth. An example is n-channel TFT as shown in FIG. 7. Production condition is gate-channel-length L=2 μm, electrode thickness Tox=80 nm, and drain voltage Vd=0.05V. The sifted voltage of hump ⊿lnAVth is measured at drain current Id=1.E-09 A. The condition of gate bias temperature stress BTS is gate voltage Vg=12 V, source voltage Vs=0 V, drain voltage Vd=0 V, Temperature=150 deg C., and stress input time=2,000 seconds. Vg-B is the gate voltage before BTS, and Vg-A is the gate voltage after BTS, shown in FIG. 5.

FIG. 5 is shown an I-V characteristics graph of a prior-art pixel TFT at gate-width W=50 μm. FIG. 6 is shown a relationship graph between gate-width W and shifted voltage of hump ⊿lnAVth according a pixel TFT substrate. ⊿lnAVth is getting worse correlation with W getting long as shown in FIG. 6. In case of W=10 μm or more less, circuit performance is good. However, W=20 μm and W=50 μm, circuit performance is bad.

Simulation Result Regarding Hump Suppressions

For study reason of hump suppressions by an alphabet-H structure of gate electrode, calculate route-resistance value for edge-current by simulations. Simulation cases are Prior art, Embodiment 1, and Embodiment 2. Simulation condition is gate-width W=50 μm, gate-channel-length L=2 μm, electrode thickness Tox=80 nm, and lightly-doped drain offset length LDD=1.25 μm. And simulation prerequisite condition is as (1) dopant of polycrystalline silicon thin film is even for depth direction, (2) Embedded type of polycrystalline silicon thin film, (3) no chamfer for all of layers, (4) Material of gate electrode, source electrode, and drain electrode is Aluminum, (5) source electrode near gate electrode is in contact-hole, and drain electrode near gate electrode is in contact-hole, (6) Fixed charge on both edge parts at polycrystalline silicon thin film (thickness is 10 nm, width is 1 μm, density is 5.E-17 $cm^{-3}$).

FIG. 7 is shown a plane view, illustrating a prior-art structure according a side part of a pixel TFT substrate. A route of edge-current is drawing as arrow direction shown in FIG. 7. FIG. 8 is shown a plane view, illustrating a structure according a side part of a pixel TFT substrate Embodiment 1. Embodiment 1 has an alphabet-H structure of gate electrode and a pair of pattern-edge lines 13E is overlapped the pair of projection part 15A, and a route of edge-current is drawing as arrow direction shown in FIG. 8. FIG. 9 is shown a plane view, illustrating a structure according a side part of a pixel TFT substrate Embodiment 2. Embodiment 2 has an alphabet-H structure of gate electrode and a projection part 15A is formed an inside position of the pair of pattern-edge lines 13E, and a route of edge-current is drawing as arrow shown in FIG. 8.

For a prior-art structure, voltage is applied at polycrystalline silicon thin film 13 that is under fixed charge. On the other hand, for each an Embodiment 1 and an Embodiment 2 is formed high resistance region that is under fixed charge. Therefore, voltage isn't applied at polycrystalline silicon thin film 13 that is under fixed charge.

The edge-current at the polycrystalline silicon thin film 13 under fixed charge is simulated. The edge-current value for each an Embodiment 1 and an Embodiment 2 is a part per million based on edge-current value of a prior-art structure.

Comparison of Hump Characteristics Between Prior-Art and Embodiment 1

Evaluate hump characteristics according to prior-art and Embodiment 1. The condition of Prior-art is gate-width W=50 μm, gate-channel-length L=2 μm, electrode thickness Tox=50 nm. The condition of Embodiment 1 is projection part length TL=8 μm, projection part width TH=2.5 μm, gate-width W=50 μm, gate-channel-length L=2 μm, electrode thickness Tox=50 nm. The condition of gate bias temperature stress BTS is gate voltage Vg=12 V, source voltage Vs=0 V, drain voltage Vd=0 V, Temperature=150 deg C., and stress input time=2,000 seconds. FIG. 10 is shown a graph showing I-V characteristics of a prior-art pixel TFT substrate. FIG. 11 is shown a graph showing I-V characteristics of a pixel TFT substrate Embodiment 1. Vg-B is the gate voltage before BTS, and Vg-A is the gate voltage after BTS.

For Embodiment 1, ⊿lnAVth is −0.2 V as shown in FIG. 11. For Prior-art, ⊿lnAVth is −1.8 V as shown in FIG. 10.

According to Embodiment 1, the over current at the pair of pattern-edge lines 13E is suppressed and the hump level is reduced, well.

Relationship Between TL/TH and ⊿lnAVth

Evaluate hump characteristics according to Embodiment 1. The condition is projection part length TL=0 μm (same as prior-art), TL=2 μm, TL=5 μm, TL=8 μm. The condition of BTS is gate voltage Vg=12 V, source voltage Vs=0 V, drain voltage Vd=0 V, Temperature=150 deg C., and stress input time=2,000 seconds.

FIG. 12 is shown a relationship graph between projection part length TL and shifted voltage of hump ⊿lnAVth according Embodiment 1. ⊿lnAVth is approaching 0 V correlation with TL getting large as shown in FIG. 12. In case of TL=2 μm or more, circuit performance is good. In case of TL=5 μm or more, circuit performance is pretty good.

Evaluate hump characteristics according to Embodiment 1. The condition is The overlapped width TH=0 μm (same as prior-art), TH=0.5 μm, TH=1.5 μm, TH=2.5 μm. The condition of BTS is gate voltage Vg=12 V, source voltage Vs=0 V, drain voltage Vd=0 V, Temperature=150 deg C., and stress input time=2,000 seconds.

FIG. 13 is shown a relationship graph between overlapped width TH and shifted voltage of hump ⊿lnAVth according Embodiment 1. ⊿lnAVth is approaching 0 V correlation with TH getting large as shown in FIG. 13. In case of TH=0.5 μm or more, circuit performance is good. In case of TH=1.5 μm or more, circuit performance is pretty good.

What is claimed is:

1. A thin film transistor on a glass substrate, the thin film transistor comprising:
   source and drain electrodes;
   a channel layer comprising a polycrystalline silicon thin film, through which electrons move between the source and drain electrodes, the direction in which the electrons move being a channel-length direction;
   a gate insulation layer; and
   a gate electrode on the gate insulation layer and over the channel, the gate electrode having a first portion extending in a channel-width direction across the channel-length direction and a pair of projection portions extending from the first portion,
      wherein the first portion has a width of 10-50 μm in the channel-width direction and a length of 0.5-2 μm in the channel-length direction.

2. The thin film transistors transistor according to claim 1, wherein one of the projection portions has a side edge extending from the first portion, the side edge having a length of 2 μm to 8 μm, and the one of the projection portions overlaps the channel layer by 0.5 μm to 2.5 μm in the channel-width direction.

3. The thin film transistor according to claim 1, wherein at least a portion of the pair of projection portions overlaps the channel layer.

4. The thin film transistor according to claim 3, wherein the channel layer has a pair of edges parallel to the channel-length direction and an outtermost edge of the pair of the projection portions is within the pair of edges of the channel layer.

5. A liquid crystal display device having a peripheral circuit on a glass substrate, the peripheral circuit comprising a thin film transistor comprising:
   source and drain electrodes;
   a channel layer comprising a polycrystalline silicon thin film, through which electrons move between the source and drain electrodes, the direction in which the electrons move being a channel-length direction;
   a gate insulation layer; and a gate electrode on the gate insulation layer and over the channel, the gate electrode having a first portion extending in a channel-width direction across the channel-length direction and a pair of projection portions extending from the first portion, wherein the first portion has a width of 10-50 μm in the channel-width direction and a length of 0.5-2 μm in the channel-length direction.

6. The liquid crystal display device according to claim 5, wherein one of the projection portions has a side edge extending from the first portion, the side edge having a length of 2 μm to 8 μm, and the one of the projection portions overlaps the channel layer by 0.5 μm to 2.5 μm in the channel-width direction.

7. The liquid crystal display device according to claim 5, wherein at least a portion of the pair of projection portions overlaps the channel layer.

8. The liquid crystal display device according to claim 7, wherein the channel layer has a pair of edges parallel to the channel-length direction and an outtermost edge of the pair of the projection portions is within the pair of edges of the channel layer.

* * * * *